(12) United States Patent
Ehm et al.

(10) Patent No.: US 8,698,999 B2
(45) Date of Patent: Apr. 15, 2014

(54) PROTECTION MODULE FOR EUV LITHOGRAPHY APPARATUS, AND EUV LITHOGRAPHY APPARATUS

(75) Inventors: Dirk Heinrich Ehm, Lauchheim (DE); Timo Laufer, Stuttgart (DE); Ben Banney, Augsburg (DE); Jens Kugler, Aalen (DE); Ulrich Nieken, Neustadt-Hambach (DE); Franz Keller, Stuttgart (DE)

(73) Assignee: CARL ZEISS SMT GmbH, Oberkochen (DE)

( * ) Notice: Subject to any disclaimer, the term of this patent is extended or adjusted under 35 U.S.C. 154(b) by 266 days.

(21) Appl. No.: 13/041,989

(22) Filed: Mar. 7, 2011

(65) Prior Publication Data

US 2011/0216298 A1 Sep. 8, 2011

Related U.S. Application Data

(63) Continuation of application No. PCT/EP2009/005588, filed on Aug. 1, 2009.

(60) Provisional application No. 61/094,744, filed on Sep. 5, 2008.

(30) Foreign Application Priority Data

Sep. 5, 2008 (DE) .......................... 10 2008 041 827

(51) Int. Cl.
*B60R 1/06* (2006.01)
*G03B 27/52* (2006.01)
*G03B 27/54* (2006.01)

(52) U.S. Cl.
USPC ................................ 355/30; 355/67; 359/509

(58) Field of Classification Search
USPC .............. 355/30, 53, 67, 70–71, 77; 359/507, 359/509
See application file for complete search history.

(56) References Cited

U.S. PATENT DOCUMENTS

| 5,696,623 | A  | * | 12/1997 | Fujie et al. ..................... 359/350 |
| 6,385,290 | B1 | * | 5/2002 | Kondo et al. ................... 378/84 |
| 2003/0095240 | A1 | * | 5/2003 | Van Schaik et al. ............ 355/30 |
| 2005/0057734 | A1 |   | 3/2005 | Johannes Stevens et al. |

(Continued)

FOREIGN PATENT DOCUMENTS

| JP | 2004-207730 A | 7/2004 |
| JP | 2005-332972 A | 12/2005 |

(Continued)

*Primary Examiner* — Toan Ton
*Assistant Examiner* — Colin Kreutzer
(74) *Attorney, Agent, or Firm* — Sughrue Mion, PLLC

(57) ABSTRACT

In EUV lithography apparatuses (10), it is proposed, in order to lengthen the lifetime of contamination-sensitive components, to arrange them in a protection module. The protection module comprises a housing (23-29) having at least one opening (37-47), in which at least one component (13*a*, 13*b*, 15, 16, 18, 19) is arranged and at which one or more gas feeds (30-36) are provided in order to introduce a gas flow into the housing (23-29), which emerges through the at least one opening (37-47). In order to effectively prevent contaminating substances from penetrating into the protection module, a light source (48-56) is arranged at the at least one opening (37-47), which light source illuminates the opening (37-47) with one or more wavelengths by which the contaminating substances can be dissociated before they penetrate through the opening (37-47).

30 Claims, 4 Drawing Sheets

(56) References Cited

U.S. PATENT DOCUMENTS

| | | | |
|---|---|---|---|
| 2005/0069433 A1* | 3/2005 | Hayashi | 417/423.4 |
| 2006/0215132 A1* | 9/2006 | Kroon et al. | 355/30 |
| 2009/0057567 A1* | 3/2009 | Bykanov et al. | 250/429 |
| 2009/0231707 A1 | 9/2009 | Ehm et al. | |
| 2009/0260654 A1 | 10/2009 | Geuppert et al. | |
| 2010/0068659 A1* | 3/2010 | Hamaya | 430/325 |

FOREIGN PATENT DOCUMENTS

| | | |
|---|---|---|
| WO | 2007006447 A1 | 1/2007 |
| WO | 2008034582 A2 | 3/2008 |
| WO | 2008-049926 A2 | 5/2008 |

* cited by examiner

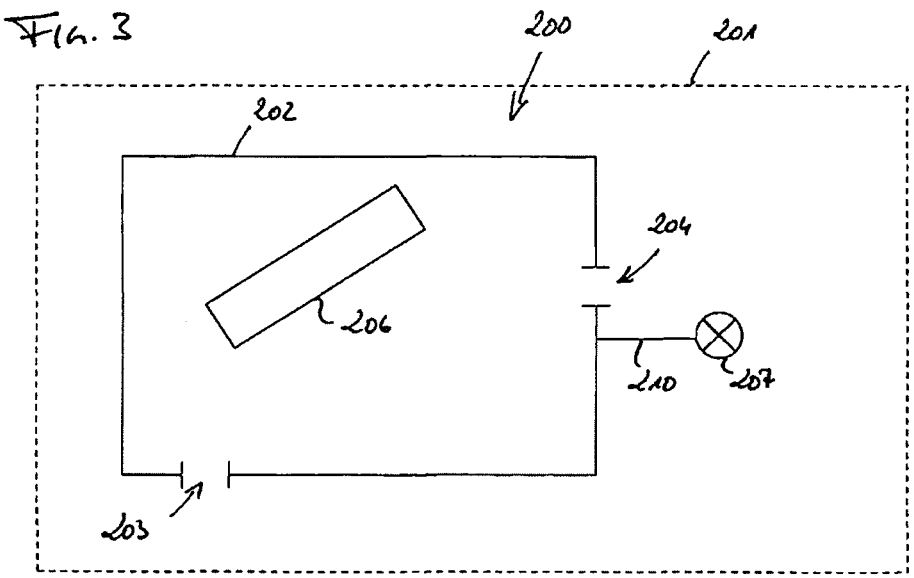
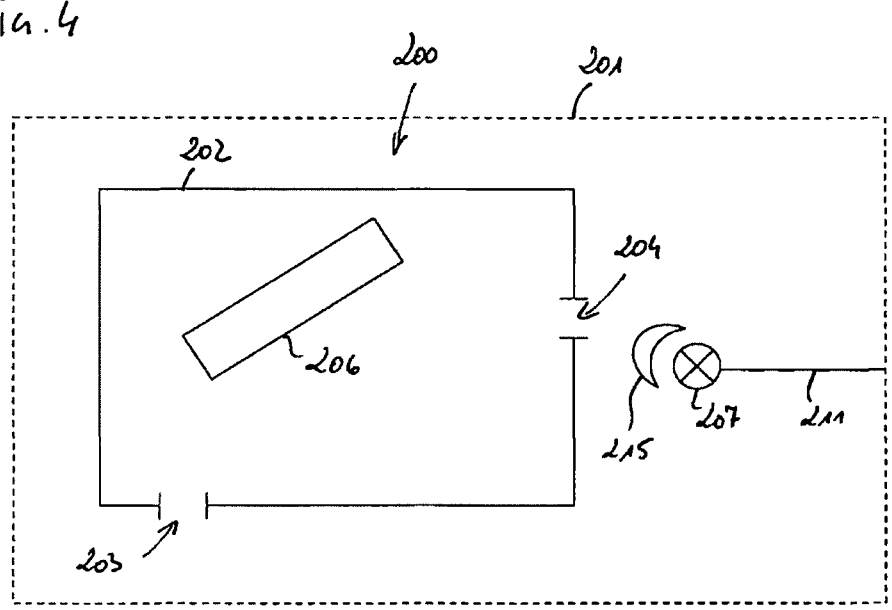

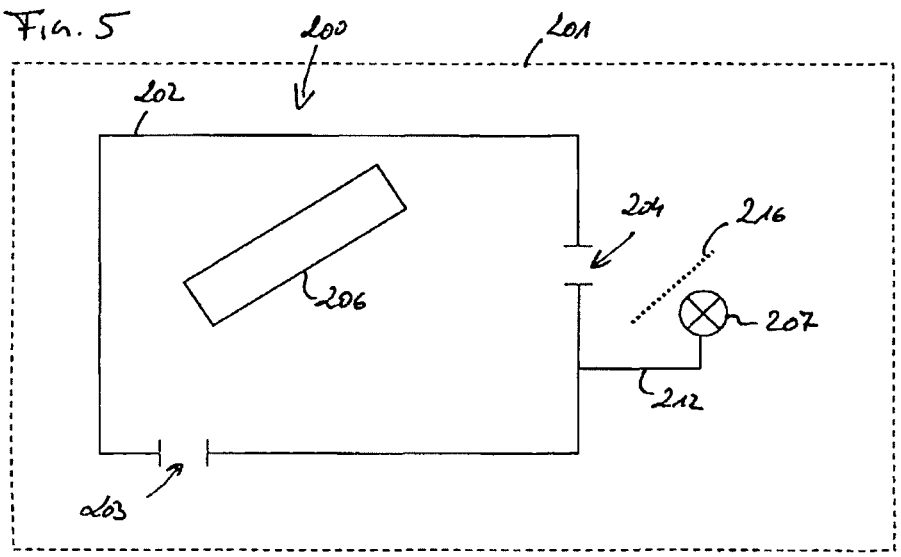
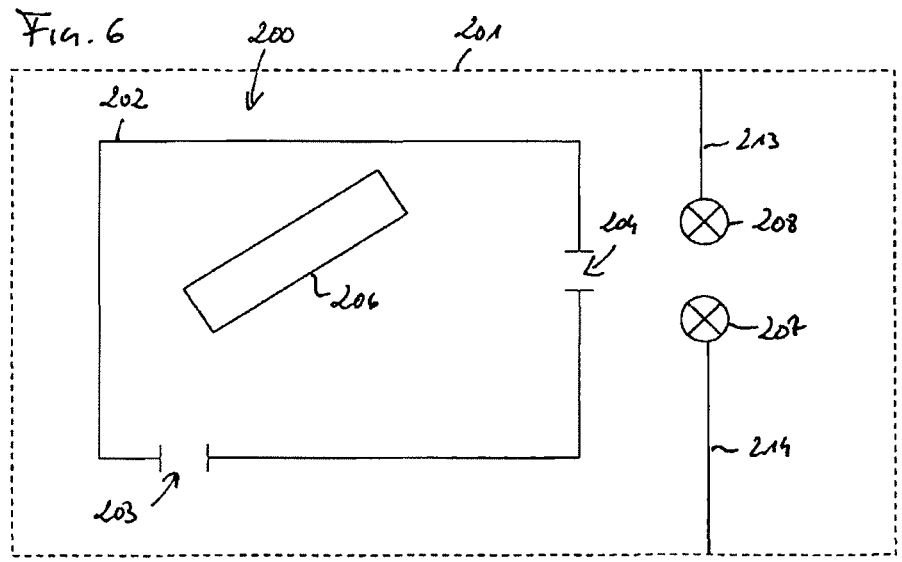
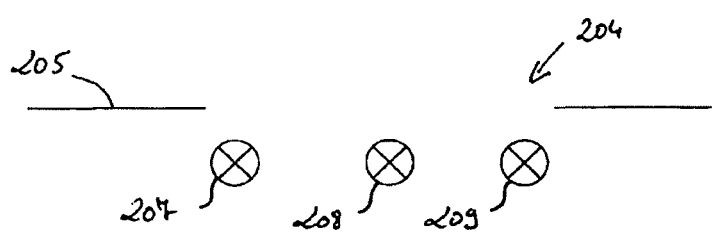

PROTECTION MODULE FOR EUV LITHOGRAPHY APPARATUS, AND EUV LITHOGRAPHY APPARATUS

CROSS-REFERENCE TO RELATED APPLICATIONS

This is a Continuation of International Application PCT/EP2009/005588, with an international filing date of Aug. 1, 2009, which was published under PCT Article 21(2) in English, and which claims priority under 35 U.S.C. §119(a) to German Patent Application No. 10 2008 041 827.7, filed on Sep. 5, 2008, and also claims the benefit under 35 U.S.C. §119(e)(1) of U.S. Provisional Application No. 61/094,744, filed on Sep. 5, 2008. The entire contents of all three applications are hereby incorporated by reference.

FIELD OF AND BACKGROUND OF THE INVENTION

The present invention relates to a protection module, in particular for an EUV lithography apparatus, comprising a housing having at least one opening, in which at least one component is arranged and at which one or more gas feeds are provided in order to introduce a gas flow into the housing, which emerges through the at least one opening. Furthermore, the present invention relates to an EUV lithography apparatus, a projection system, an illumination system and a beam-shaping system for EUV lithography apparatuses in which at least one protection module of this type is arranged.

In EUV lithography apparatuses, reflective optical elements for the extreme ultraviolet (EUV) or soft X-ray wavelength range (e.g. wavelengths of between approximately 5 nm and 20 nm) such as photomasks, or multilayer mirrors, for instance, are used for the lithography of semiconductor devices. Since EUV lithography apparatuses generally comprise a plurality of reflective optical elements, they should have a highest possible reflectivity in order to ensure a sufficiently high total reflectivity. The reflectivity and the lifetime of the reflective optical elements can be reduced by contamination of the optically utilized reflective surface of the reflective optical elements, which arises on account of the short-wave irradiation together with residual gases in the operating atmosphere.

Since a plurality of reflective optical elements are usually arranged one behind another in an EUV lithography apparatus, even relatively small contaminations on each individual reflective optical element affect the total reflectivity to a relatively large extent.

Reflective optical elements for the EUV or soft wavelength range generally have multilayer systems. These multilayer systems have alternately applied layers of a material having a higher real part of the refractive index at the operating wavelength (also called spacers) and of a material having a lower real part of the refractive index at the operating wavelength (also called absorbers), wherein an absorber-spacer pair forms a stack. In certain respects a crystal is thereby simulated whose network planes correspond to the absorber layers at which Bragg reflection takes place. The thicknesses of the individual layers and also of the repeating stacks can be constant over the entire multilayer system or alternatively vary, depending on what reflection profile is intended to be achieved.

Contamination-sensitive components can be incorporated into protective housings. In many cases, however, it is not possible to prevent an opening from nevertheless remaining in order to ensure the functionality of the respective component. Use is therefore made of protection modules comprising a housing having at least one opening, in which at least one component is arranged, wherein one or more gas feeds are provided in order to introduce a gas flow into the housing, which emerges through the at least one opening.

OBJECTS AND SUMMARY OF THE INVENTION

However, particularly at partial pressures of contaminants outside the housing which are higher than expected, it can happen that, counter to the purging gas flow, contaminants penetrate into the housing through the at least one opening and lead to contamination of sensitive components, e.g. of reflective optical elements, in the housing.

It is an object of the present invention to provide a protection module, in particular for an EUV lithography apparatus, and an EUV lithography apparatus wherein the lifetime of contamination-sensitive components is lengthened in comparison with conventional EUV lithography apparatuses.

According to one formulation of the invention, this object is achieved with a protection module, comprising a housing having at least one opening, in which at least one component is arranged and at which one or more gas feeds are provided in order to introduce a gas flow into the housing, which emerges through the at least one opening, wherein a light source is arranged at the at least one opening.

It has been found that the light emitted by the light source influences the contaminants at the at least one opening through absorption of the light, such that they have a smaller contamination effect. For example, they are excited to react with other residual gases in the vacuum to form less contaminating substances or are excited in such a way that their adsorption behavior at the surfaces of the contamination-sensitive components is impaired.

The at least one opening can be e.g. one or more openings that have to be provided in the housing in order that the component can be used functionally. However, untight locations in the housing can also be outfitted in accordance with the invention.

According to another formulation of the invention, the above object is addressed with an EUV lithography apparatus and/or a projection system, an illumination system, or a beam-shaping system for an EUV lithography apparatus in which at least one of these protection modules is arranged.

According to a further formulation, the above object is achieved by an EUV lithography apparatus and by a projection system, an illumination system, and/or a beam-shaping system for an EUV lithography apparatus, comprising a vacuum chamber and at least one component, wherein the component is arranged in a housing within the vacuum chamber, said housing having one or more gas feeds in order to introduce a gas flow into the housing, which emerges from the housing through at least one opening, and wherein a light source is arranged outside the housing at the at least one opening.

BRIEF DESCRIPTION OF THE DRAWINGS

The present invention will be explained in greater detail with reference to various exemplary embodiments. In this respect:

FIG. 3 schematically shows a first variant of an embodiment of a protection module with a light source;

FIG. 4 schematically shows a second variant of an embodiment of a protection module with a light source and a lens;

FIG. 5 schematically shows a third variant of an embodiment of a protection module with a broadband light source and a monochromator;

FIG. 6 schematically shows a fourth variant of an embodiment of a protection module with two narrowband light sources; and FIG. 7 shows schematically and as an excerpt a further variant of an embodiment of a protection module with three light sources.

DETAILED DESCRIPTION OF VARIOUS EMBODIMENTS

Figure 1:
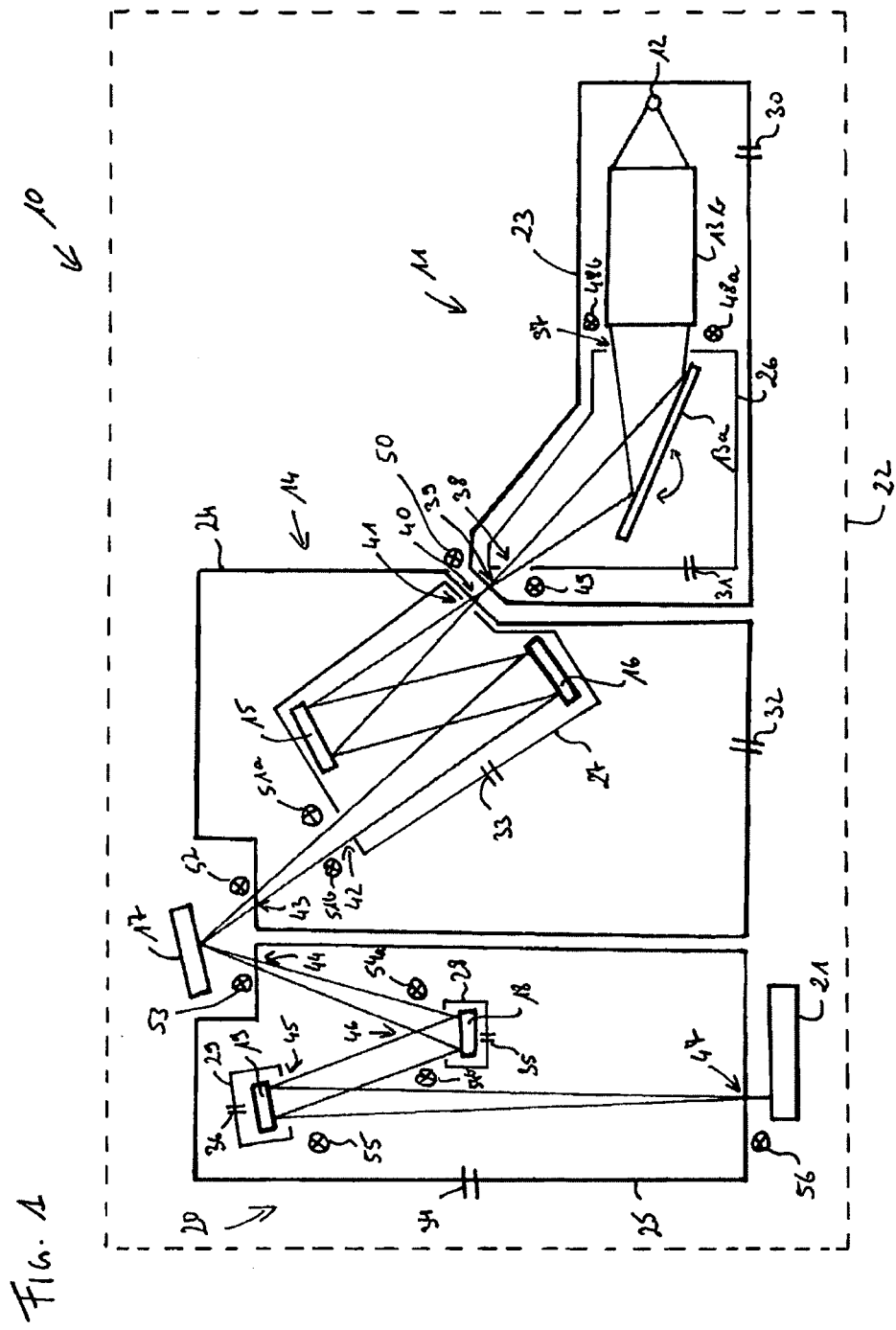
FIG. 1 schematically shows a first embodiment of an EUV lithography apparatus.

FIG. 1 schematically illustrates an EUV lithography apparatus 10. Primary components are the beam-shaping system 11, the illumination system 14, the photomask 17 and the projection system 20. The EUV lithography apparatus 10 is operated under vacuum conditions in a vacuum chamber 22 in order that the EUV radiation is absorbed as little as possible in its interior.

By way of example, a plasma source or else a synchrotron can serve as radiation source 12. The emerging radiation in the wavelength range of approximately 5 nm to 20 nm is firstly concentrated in the collimator 13b. In addition, with the aid of a monochromator 13a, the desired operating wavelength is filtered out by varying the angle of incidence. In the wavelength range mentioned, the collimator 13b and monochromator 13a are usually embodied as reflective optical elements. Collimators are often reflective optical elements embodied in shell-shaped fashion in order to achieve a focusing or collimating effect. Collimators which are used with perpendicular incidence rather than glancing incidence are often also called collectors. The filtering-out of a narrow wavelength band by reflection takes place at the monochromator, often with the aid of a grating structure or a multilayer system. A monochromator can also be dispensed with in the case of narrowband radiation sources.

The operating beam conditioned with respect to wavelength and spatial distribution in the beam-shaping system 11 is then introduced into the illumination system 14. In the example illustrated in FIG. 1, the illumination system 14 has two mirrors 15, 16, which are configured as multilayer mirrors in the present example. The mirrors 15, 16 direct the beam onto the photomask 17, which has the structure that is intended to be imaged onto the wafer 21. The photomask 17 is likewise a reflective optical element for the EUV and soft wavelength range, which is exchanged depending on the production process. With the aid of the projection system 20, the beam reflected from the photomask 17 is projected onto the wafer 21 and the structure of the photomask 17 is thereby imaged onto said wafer. In the example illustrated, the projection system 20 has two mirrors 18, 19, which are likewise configured as multilayer mirrors in the present example. It should be pointed out that both the projection system 20 and the illumination system 14 can likewise have in each case only one or alternatively three, four, five or more mirrors.

In EUV lithography apparatuses, in particular long-chain, nonvolatile hydrocarbons lead to carbon growth on mirrors and other components under EUV irradiation. The main source for these hydrocarbons can be found in the vacuum environment. In particular, in all the movable parts of an EUV lithography apparatus such as for moving the wafers or displacing the photomasks, for instance, lubricants are used which essentially comprise long-chain, nonvolatile hydrocarbon molecules. Both the beam-shaping system 11 and the illumination system 14 and the projection system 20 have, inter alia, chambers 23, 24, 25 configured as vacuum chambers for protection against carbon contamination, since the multilayer mirrors 15, 16, 18, 19, in particular, can only be operated in vacuo. Too much contamination would otherwise deposit on their reflective surface and lead to an excessively great impairment of their reflectivity.

In the example of an EUV lithography apparatus 10 as illustrated in FIG. 1, the chambers 23-25 are purged with inert gas, for example, by providing gas feeds 30, 32, 34, said gas emerging through openings 37, 40, 43, 44, 47. As a result, a slight excess pressure prevails in the chambers 23-25 by comparison with the interior of the vacuum chamber 22 and this prevents contaminating substances such as hydrocarbons, for example, from coming to the collimator 13b or the monochromator 13a or the EUV mirrors 15, 16, 18, 19 and depositing there as contamination on the optically utilized surfaces. The purging can be carried out in particular with gas that only negligibly absorbs radiation in the range of 5 nm to 20 nm, also during operation of the EUV lithography apparatus 10. Helium, argon or other noble gases or hydrogen are preferably used.

The openings 37, 40, 43, 44, 47 at the interfaces between beam-shaping system 11 and illumination system 14, illumination system 14 and photomask 17 with handling mechanism (not illustrated), photomask 17 with handling mechanism and projection system 20, and projection system 20 and wafer 21 with transport system are unavoidable. This is so, inter alia, because passage regions for the EUV radiation are involved. At all these openings 37, 40, 43, 44, 47, hydrocarbons can diffuse into the chambers 23-25 counter to the purging gas flow. Particularly if a hydrocarbon partial pressure higher than originally assumed prevails in the outer vacuum chamber 22, this can no longer be compensated for by the vacuum in the chambers 23-25, thus increasing the probability that long-chain, nonvolatile hydrocarbons in the interior of the chambers 23-25 will reach surfaces of contamination-sensitive components such as, for instance, EUV mirrors, particularly on the basis of multilayer systems, and lead to carbon growth there during the EUV irradiation. In the case of mirrors, this results in a reflectivity loss and hence a transmission loss of the beam-shaping system 11, illumination system 14 or projection system 20.

For additional protection against contamination, in the present example the mirrors 15, 16, 18, 19 and the monochromator 13a are encapsulated in housings 26, 27, 28, 29, which are respectively provided with dedicated gas feeds 31, 33, 35, 36. These gas feeds 31, 33, 35, 36 introduce gas flow into the respective housings 26-29, which emerges through the openings 37, 38, 41, 42, 45, 46, with the result that the interiors of the housings are purged. This arrangement separates the components 15, 16, 18, 19, 13a vacuum-technologically from the rest of the vacuum in the beam-shaping system 11, illumination system 14 or projection system 20, such that the components 15, 16, 18, 19, 13a are situated in respective microenvironments and are protected against penetrating components. This arrangementuse cleaning gas as needed in the interior of any one of the housings 26-29, such as atomic hydrogen or oxygen-containing gases, for example, without further components outside the respective housing 26-29 being impaired thereby.

It should be pointed out that it is possible to arrange in a housing in each case one contamination-sensitive component, such as, for instance, the mirrors 18, 19 respectively in the housings 28, 29 or the monochromator 13a in the housing 26, or alternatively a plurality of contamination-sensitive components, such as, for instance, the mirrors 15, 16 in the housing 27. It should furthermore be pointed out that, for the sake of better clarity, here the illustration always shows only one gas feed per housing, but it is also possible, of course, to provide a plurality of gas feeds, for example in order to vary the composition of the gas being fed.

The microenvironments formed by the purged housings are designed for specific suppression rates for contaminants and cannot always compensate for unexpectedly higher contaminant partial pressures outside the microenvironment. As additional protection against the penetration of contaminants, light sources 48-56 are arranged at the critical openings of the housings 26-29 and of the chambers 23-25. The light emitted by the light sources 48-56 influences the contaminants at the openings 37, 38, 41, 42, 45, 46 by absorption of the light to the effect that they have a smaller contamination effect. For example, they are excited to react with other residual gases in the vacuum to form less contaminating substances or are excited in such a way that their adsorption behavior at surfaces changes.

In preferred embodiments, the light sources are selected to the effect that the wavelength of their respectively emitted light is suitable for dissociating specific contaminants. The dissociation products generally have a smaller contaminating effect. By way of example, they are often volatile compounds that can be pumped out. The energy or wavelength required for the dissociation of contaminants depends on the type of bonds within the respective contaminant. Light sources whose wavelengths lie in the ultraviolet wavelength range are preferably chosen. This wavelength range corresponds approximately to the energy range encompassing the energies for dissociating most types of bond. Light sources whose wavelengths lie in the range of 400 nm to 150 nm are advantageously used. Light having shorter wavelengths can also be used to advantageous effect.

This will be explained in greater detail using the example of contaminants in the form of long-chain, nonvolatile hydrocarbons. A considerable proportion of hydrocarbons have carbon-carbon and carbon-hydrogen bonds. The dissociation of long-chain, nonvolatile hydrocarbons using photolysis can take place at different wavelengths depending on the bond to be dissociated. Thus, e.g. carbon single bonds are dissociated at a wavelength of approximately 343 nm, carbon double bonds at a wavelength of approximately 196 nm and hydrogen-carbon bonds at a wavelength of approximately 289 nm. In some instances it is advantageous if reactants for the dissociation products are present in the residual gas atmosphere, in order that uncharged and stable smaller, more volatile molecules arise. Thus, by way of example, a propane molecule in the presence of a hydrogen molecule can be dissociated into two ethane molecules by radiating in light having a wavelength of 343 nm. The advantage of dissociating long-chain, nonvolatile hydrocarbon compounds into shorter, volatile hydrocarbon compounds is that the short hydrocarbon compounds that arise have a significantly poorer adsorption behavior on the materials that generally form the surface of EUV mirrors on the basis of multilayer systems. Therefore, upon EUV irradiation of the affected surface, distinctly less carbon growth takes place than if the longer-chain hydrocarbon compounds were adsorbed.

Advantageously, the light sources used are excimer lasers or mercury lamps as UV light sources. Excimer lasers are narrowband light sources and permit a high radiation intensity. Despite the high intensity, the thermal load on the environment of the illuminated opening is small since no infrared radiation is emitted. Depending on the excited substance, excimer lasers are available for various wavelengths in the UV range: by way of example, xenon chloride emits at 308 nm, xenon bromide at 282 nm, argon fluoride at 193 nm, and fluorine at 157 nm. Xenon bromide excimer lasers are therefore suitable e.g. for the dissociation of hydrogen-carbon bonds, and argon fluoride excimer lasers for the dissociation of carbon double bonds.

Mercury lamps are broadband light sources. Low-pressure mercury lamps have a small visible light component and a large ultraviolet light component with a primary peak around 254 nm. Amalgam lamps yield a comparable spectrum with higher power density and a longer lifetime. In addition, amalgam lamps can be used at an ambient temperature of up to 90° C., while low-pressure mercury lamps can only be used at lower ambient temperatures. Medium-pressure mercury lamps emit selectively in the wavelength range of 400 nm to 250 nm. With the aid of a monochromator or a suitable filter, for example the wavelength of 343 nm can be filtered out from the spectrum of a medium-pressure mercury lamp or some other mercury lamp, in order to dissociate carbon single bonds.

Overall it is advantageous to provide light from a largest possible wavelength range or as many different wavelengths as possible at an opening to be illuminated, in order to dissociate as many different bonds as possible. However, this may be limited by the space requirement of the light sources.

A particularly good photolysis effect is achieved if the relevant opening through which penetration of contamination for example in the form of long-chain, nonvolatile hydrocarbons is intended to be avoided is illuminated as completely as possible. For this purpose, in the example illustrated in FIG. 1, instead of only one light source two light sources 48a,b, 51a,b, 54a,b are arranged at the openings 37, 42, 46. It is also possible as necessary to provide three, four, five or more light sources for an opening. If more than one light source is provided at an opening, they can be selected in respect of their emitting light of different wavelengths, each wavelength being selected for the dissociation of a different bond. Contaminants can be dissociated particularly efficiently as a result.

It should be pointed out that, in principle, the one or the plurality of light sources can be arranged both on the inside and on the outside of the opening to be illuminated. An arrangement on the outside of the opening is preferred, however, firstly because there will generally be more space there for the arrangement of one or a plurality of light sources, and secondly because contamination is suppressed more efficiently when the contaminants are dissociated prior to penetrating into the respective microenvironment. A further advantage of the arrangement on the outside of the opening is that scattered light components on the inside, which could otherwise lead to imaging aberrations, are also reduced.

Moreover, it should be pointed out that apart from reflective optical elements, it is also possible to house further components for protection against contamination in microenvironments in the form of purged housings with openings illuminated by dedicated light sources. These include for example all components made of materials susceptible to contamination or else components whose function can be impaired by contamination, such as, for instance, sensors as used for detecting or setting the position of other components or for detecting the intensity of the operating radiation of the EUV lithography apparatus or for detecting the degree of contamination in the interior of the EUV lithography apparatus.

Figure 2:
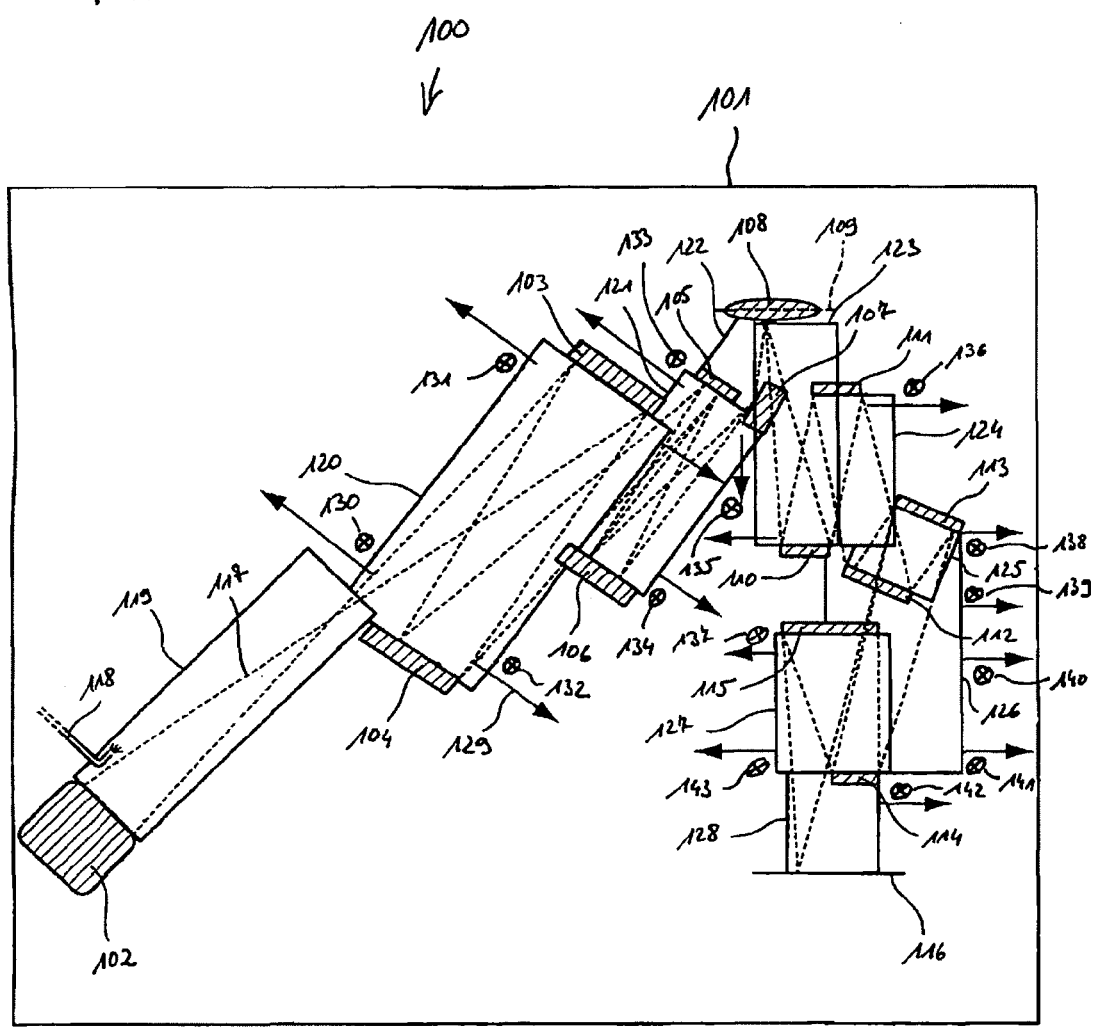
FIG. 2 schematically shows a second embodiment of an EUV lithography apparatus.

FIG. 2 schematically illustrates a further example of an embodiment of an EUV lithography apparatus 100 with protection modules comprising gas-purged housings with illuminated openings. Arranged within a vacuum chamber 101 are a collector mirror 102 for concentrating the radiation from a radiation source (not illustrated) in the wavelength range of 5 nm to 20 nm, the mirrors 103, 104, 105, 106 and 107 of the illumination system, a photomask 108, which has in the object plane 109 the structure that is arranged to be projected onto the wafer 116 by the beam 117, and also the mirrors 110, 111, 112, 113, 114 and 115 of the projection system. All the mirrors 102-107, 110-115 and also the wafer 116 are arranged in housings 119, 120, 121, 122, 123, 124, 125, 126, 127, 128 in such a way that their reflective surface and respectively the surface to be exposed, that is to say the contamination-sensitive surfaces, are situated within the housings 119-128.

In the example illustrated in FIG. 2, all the housings are flow-directionally connected to one another, such that the gas for purging the housings 119-128 or for increasing the pressure within the housings 119-128 compared with the vacuum within the vacuum chamber 101 is fed by a feed 118 in the housing 119 of the collimator mirror 102. The gas flows out of the housing 119 through the transition to the next housing 120 for the mirrors 103, 104. The transition from housing 119 to housing 120 serves as a gas feed for the housing 120. All the housings 119-128 are connected to one another in this way. In order to generate a pressure gradient so that the gas flows from the housing 119 into the housing 120, openings are present in the housing 120 and in the further housings, which are indicated by the arrows 129 and through which gas escapes. In this case, a housing can also have a plurality of openings, such as housings 120, 121, 126, 127 for example. Pumps can be connected to the openings in order to pump the gas. This is particularly advantageous if residual gas molecules or residual gas atoms which are not intended to emerge into the vacuum chamber 101 are intended to be removed from the housings 119-128.

In order to prevent harmful contaminants from penetrating via the openings, light sources 130, 131, 132, 133, 134, 135, 136, 137, 138, 139, 140, 141, 142, 143 are arranged at the openings in order to illuminate the openings so that the harmful contaminants are made less harmful by absorption of the light from the light sources 130-143, e.g. in that they are dissociated into less contaminating molecules. Thus, by way of example, long-chain, nonvolatile hydrocarbons can be dissociated into shorter, volatile hydrocarbons which have a reduced adsorption on the mirror surfaces or the wafer surface. Depending on space conditions, one or a plurality of light sources are arranged per opening in order to be able to illuminate it as completely as possible. In the case of the light source 135, it is even possible to illuminate two openings with one light source. The light sources 130-143 are preferably UV light sources.

Various embodiments of protection modules for use in EUV lithography apparatuses and in beam-shaping, illumination or projection systems are explained below.

FIGS. 3 to 6 schematically illustrate different variants of protection modules 200 which are arranged in a vacuum chamber 201. A contamination-sensitive component, e.g. a reflective optical element such as, for instance, an EUV mirror having a multilayer coating, is arranged in a housing 202 situated in the vacuum chamber 201. The housing 202 is provided with a gas feed 203, through which a gas flow is introduced, the latter emerging through the opening 204, whereby the interior of the housing is purged and penetration of contaminants into the housing 202 is thereby effectively prevented up to specific partial pressures of contaminants outside the housing 202. In order to reinforce this effect and as far as possible to prevent contamination of the component 206 even at unexpectedly high partial pressures of contaminants, in the example illustrated in FIG. 3 a light source 207 is arranged outside the housing 202 at the opening 204 in order to illuminate the latter and in the process to dissociate contaminants into less contaminating substances. In this case, the light source 207 is fixed to the housing 202 with a mount 210.

In the example illustrated in FIG. 4, in contrast to that illustrated in FIG. 3, a lens 215 is arranged between the light source 207 and the opening 204 in order to spatially spread the light emitted by the light source 207 so that the opening 204 is completely illuminated. This increases the efficiency when dissociating contaminants that could penetrate through the opening. In this example, the light source 207 is fixed to the vacuum chamber 201 with the mount 211. It could also be fixed to any other structural part in the vicinity of the opening 204.

In the example illustrated in FIG. 5, the light source 207 is a broadband light source that is fixed to the housing 202 using a mount 212. With the aid of a wavelength filter embodied here as a grating monochromator 216, the wavelength corresponding to the energy required for dissociating a bond within the contaminant that is disturbing in the individual case is provided through the filter. The grating monochromator 215 can advantageously be rotated relative to the light source 207 in order gradually also to provide other appropriate wavelengths.

In contrast to the example illustrated in FIG. 5, in the example illustrated in FIG. 6, two narrowband light sources 207 and 208 are used, which emit at respectively different wavelengths in order to dissociate two different bonds of the disturbing contaminant. The two light sources 207, 208 are fixed with mounts 213, 214 to the vacuum chamber 201 or to other structural parts in the vicinity of the opening 204 to be illuminated.

It should be pointed out that it is also possible to arrange three, four, five or more light sources at the opening in order to provide one or a plurality of wavelengths for dissociating bonds. FIG. 7 illustrates schematically and as an excerpt the illumination of a large opening 204 in the housing section 205 using three light sources 207, 208, 209. The wavelengths thereof preferably lie in the range of 400 nm to 150 nm, particularly preferably in the range of 350 nm to 180 nm. In other embodiments, wavelengths of 150 nm or shorter are preferably used. Furthermore, it should be pointed out that broadband and narrowband light sources can also be combined.

The above description of the preferred embodiments has been given by way of example. From the disclosure given, those skilled in the art will not only understand the present invention and its attendant advantages, but will also find apparent various changes and modifications to the structures [and methods] disclosed. The applicant seeks, therefore, to cover all such changes and modifications as fall within the spirit and scope of the invention, as defined by the appended claims, and equivalents thereof.

The invention claimed is:

1. A protection module, comprising:
   a housing having at least one opening through which a first light of a first light source passes to illuminate a wafer to image a structure onto the wafer, and configured and arranged to house at least one component,
   at least one gas feed configured and arranged to introduce a gas flow into the housing, which emerges through the at least one opening, and
   a second light source arranged at the at least one opening and configured to illuminate the at least one opening with a second light which dissociates a contaminating substance when the wafer is illuminated by the first light, wherein the second light source is arranged outside the housing.

2. The protection module as claimed in claim 1, wherein the second light emitted by the second light source has a wavelength selected to dissociate a predetermined contaminating substance.

3. The protection module as claimed in claim 1, wherein the second light source is configured to emit ultraviolet (UV) light.

4. The protection module as claimed in claim 1, wherein the second light source is configured to emit a broadband spectrum.

5. The protection module as claimed in claim 1, wherein the second light source is configured to emit a narrowband spectrum.

6. The protection module as claimed in claim 1, further comprising at least one further light source arranged at the at least one opening.

7. The protection module as claimed in claim 1, wherein the second light source is configured and arranged to illuminate completely the at least one opening.

8. The protection module as claimed in claim 1, wherein the component is a reflective optical element.

9. An extreme-ultra-violet lithography apparatus, comprising at least one protection module as claimed in claim 1.

10. A sub-system for an extreme ultra-violet lithography apparatus, comprising at least one protection module as claimed in claim 1, wherein the sub-system consists essentially of a projection system, an illumination system or a beam-shaping system.

11. The protection module as claimed in claim 1, wherein the first light comprises extreme ultra-violet (EUV) light.

12. An extreme ultra-violet (EUV) lithography apparatus, comprising:
a vacuum chamber,
a housing within the vacuum chamber and at least one component arranged in the housing,
at least one gas feed configured and arranged to introduce a gas flow into the housing, which emerges from the housing through at least one opening through which a first light of a first light source passes to illuminate a wafer to image a structure onto the wafer, and
a second light source arranged outside the housing at the at least one opening and configured to illuminate the at least one opening with a second light which dissociates a contaminating substance when the wafer is illuminated by the first light.

13. The EUV lithography apparatus as claimed in claim 12, wherein the second light emitted by the second light source has a wavelength selected to dissociate a predetermined contaminating substance.

14. The EUV lithography apparatus as claimed in claim 12, wherein the second light source is configured to emit ultraviolet (UV) light.

15. The EUV lithography apparatus as claimed in claim 12, wherein the second light source is configured to emit a broadband spectrum.

16. The EUV lithography apparatus as claimed in claim 12, wherein the second light source is configured to emit a narrowband spectrum.

17. The EUV lithography apparatus as claimed in claim 12, further comprising at least one further light source arranged at the at least one opening.

18. The EUV lithography apparatus as claimed in claim 12, wherein the second light source is configured and arranged to illuminate completely the at least one opening.

19. The EUV lithography apparatus as claimed in claim 12, wherein the component is a reflective optical element.

20. The EUV lithography apparatus as claimed in claim 12, wherein the first light comprises extreme ultra-violet (EUV) light.

21. A sub-system for an extreme ultra-violet lithography apparatus, comprising:
a vacuum chamber,
a housing within the vacuum chamber and at least one component arranged in the housing,
at least one gas feed configured and arranged to introduce a gas flow into the housing, which emerges from the housing through at least one opening through which a first light of a first light source passes to illuminate a wafer to image a structure onto the wafer, and
a second light source arranged outside the housing at the at least one opening and configured to illuminate the at least one opening with a second light which dissociates a contaminating substance when the wafer is illuminated by the first light,
wherein the sub-system consists essentially of a projection system, an illumination system or a beam-shaping system.

22. The system as claimed in claim 21, wherein the second light emitted by the second light source has a wavelength selected to dissociate a predetermined contaminating substance.

23. The system as claimed in claim 22, wherein the gas feed introduces hydrogen or a noble gas, wherein the contaminating substance comprises a hydrocarbon, and wherein the selected wavelength comprises an ultraviolet wavelength.

24. The system as claimed in claim 21, wherein the second light source is configured to emit ultraviolet (UV) light.

25. The system as claimed in claim 21, wherein the second light source is configured to emit a broadband spectrum.

26. The system as claimed in claim 21, wherein the second light source is configured to emit a narrowband spectrum.

27. The system as claimed in claim 21, further comprising at least one further light source arranged at the at least one opening.

28. The system as claimed in claim 21, wherein the second light source is configured and arranged to illuminate completely the at least one opening.

29. The system as claimed in claim 21, wherein the component is a reflective optical element.

30. The system as claimed in claim 21, wherein the first light comprises extreme ultra-violet (EUV) light.

* * * * *

UNITED STATES PATENT AND TRADEMARK OFFICE
CERTIFICATE OF CORRECTION

PATENT NO. : 8,698,999 B2
APPLICATION NO. : 13/041989
DATED : April 15, 2014
INVENTOR(S) : Dirk Heinrich Ehm It is certified that error appears in the above-identified patent and that said Letters Patent is hereby corrected as shown below:

In the Specification:

Column 1, Line 50; change "soft wavelength" to -- soft X-ray wavelength --;

Column 3, Lines 50-51; change "soft wavelength" to -- soft X-ray wavelength --;

Column 4, Line 59; change "arrangementuse" to -- arrangement uses --.

Signed and Sealed this
Twenty-seventh Day of October, 2015

Michelle K. Lee
*Director of the United States Patent and Trademark Office*